United States Patent [19]
Martel et al.
[11] 3,906,387
[45] Sept. 16, 1975

[54] AMPLIFIER FOR HIGH-FREQUENCY SIGNALS

[75] Inventors: Hubert Martel, St. Germain La Blanche Herbe; Pierre Paris, Courseulles, both of France

[73] Assignee: U.S. Philips Corporation, New York, N.Y.

[22] Filed: Mar. 4, 1974

[21] Appl. No.: 447,556

[30] Foreign Application Priority Data
Mar. 2, 1973 France ............................ 73.073535

[52] U.S. Cl. .................. 330/31; 330/38 M; 330/56; 330/57; 333/84 M
[51] Int. Cl.$^2$ ............................................ H03F 3/04
[58] Field of Search ......... 330/21, 31, 38 M, 53, 56, 330/57; 333/73 S, 84 M

[56] References Cited
UNITED STATES PATENTS

| | | | |
|---|---|---|---|
| 2,915,718 | 12/1959 | Grieg et al. | 333/84 M |
| 3,133,207 | 5/1964 | Ayer | 333/84 M |
| 3,155,881 | 11/1964 | St. Jean | 333/84 M |
| 3,792,383 | 2/1974 | Knappenberger | 333/84 M |

*Primary Examiner*—James B. Mullins
*Attorney, Agent, or Firm*—Frank R. Trifari; Ronald L. Drumheller

[57] ABSTRACT

An amplifier for high-frequency signals which comprises a transistor. The input circuit comprises two conductors which form a transmission line and which are connected on the other end to the base and the emitter of the transistor. One of these conductors is electrically shielded from the ground conductor by the other conductor, and this other conductor forms a transmission line having a length λ/4 in conjunction with the ground conductor. This other conductor is connected on the side of the input to the ground conductor via a coupling member which blocks direct current. Various embodiments are described with thin metal layers and coaxial cables. The input signals can be applied to the said one conductor and the ground conductor.

5 Claims, 10 Drawing Figures

AMPLIFIER FOR HIGH-FREQUENCY SIGNALS

BACKGROUND OF THE INVENTION

1. Field of the Invention

The invention relates to an amplifier for high-frequency signals, comprising a conductive ground plate to which a transistor is attached which is provided with an emitter, a base and a collector, and furthermore comprising a signal input and a signal output which have one point in common, the base and the emitter being provided with contacts, one contact of a pair of contacts, comprising a base contact and an emitter contact, being coupled to the signal input, the other contact being coupled to the said common point, the collector being coupled to the signal output.

The invention relates to the field of very high frequency and high power transistor amplifiers and resulted from investigations utilizing power transistors in the frequency range of fram 1.5 to 2 GHz, but there is nothing in the invention which restricts it to the said frequency range; on the contrary, the invention can also be advantageously applied for much higher frequencies as well as for lower frequencies. The invention notably relates to common-base circuits and common-emitter circuits the normal circuit configurations for the application under consideration in which the output signal is derived from the collector.

2. Description of the Prior Art

According to the present state of the art transistors are formed on a substrate of n-type Si which acts as the collector in the finished transistor. In the circuits comprising transistors according to the present state of the art, in which the output signal is derived between the collector and a common point of the circuit (ground, earth) whereto the emitter or the base is also connected, it is necessary to isolate the collector from ground.

In power transistors there is the problem of removing the heat developed in the collector; for this reason the substrate is connected on a metallic layer which is provided on a layer of a material, usually BeO, which has proper heat conducting and poor current conducting properties, the said layer being provided on a good conducting ground plate.

In other circuits according to the present state of the art, the emitter and the base of the transistor are isolated from the signal input by way of a transformer. However, this transformer restricts the use of these circuits to the low-frequency range. The use of the transformer makes it possible to attach the substrate directly on the base plate so that the transmission of heat is improved. The output signal is in this case derived between the collector and the base or the emitter.

SUMMARY OF THE INVENTION

The amplifier for high-frequency signals according to the invention is characterized in that two conductors which extend mutually parallel and parallel to the ground plate are provided between the signal input and the transistor, one of the conductors being connected on the side of the transistor to the said one contact, the other conductor being connected on the side of the transistor to the said other contact, the other conductor being connected on the side of the signal input to the ground plate via a coupling member which blocks direct current, the said other conductor being placed between the said one conductor and the ground plate so as to form an electric shield between the said one conductor and the ground plate.

In this case the substrate can be attached directly to the ground plate, thus ensuring a good transmission of heat, to the ground plate.

A number of different embodiments of the two mutually parallel conductors are feasible. A general category of embodiments is represented by a pair of coaxial conductors; one conductor being completely enclosed by the other conductor. In other embodiments the two conductors are formed by strip conductors, one conductor being provided on the other conductor which is provided on the ground plate, the conductors being isolated by intermediate layers of a dielectric material.

In all embodiments the length of the other conductor, i.e. the conductor which is coupled to the ground plate, is chosen such that in the centre of the frequency band the length is equal to one quarter of the wavelength of the electromagnetic waves which could propogate between this conductor and the ground plate. The coupling member which is arranged near the signal input between this conductor and the ground plate constitutes an effective short-circuit for the signal frequencies. This short-circuit is transformed into a very high impedance between the said common point and the ground plate by the $\lambda/4$-transmission line, which is formed by the other conductor and the ground plate. The common point can then have a floating potential with respect to the signal input and is then suitable for connection to a load impedance.

A major advantage of this amplifier is that the connecting wires to the transistor may be kept very short, with the result that the parasitic inductances are reduced and parasitic series resonances are shifted to extremely high frequencies. As a result, wide frequency bands can be amplified or a higher gain can be realized in a given frequency band.

A known problem in a common-base circuit for very high frequencies is the risk of oscillation due to the parasitic inductance of the common-base connection. The risk of oscillation is substantially mitigated in the amplifier according to the invention.

The invention can also be advantageously used in cases where a number of transistors are connected in parallel to the same signal input and signal output so as to achieve high power amplification. In this case the length of the one conductor which forms a transmission line in conjunction with the other conductor, is chosen such that this transmission line also has a length of $\lambda/4$. The impedance transformation of these transmission lines ensures that when a plurality of transistors are connected in parallel a uniform current distribution over the transistors is achieved and that there is a thermal equilibrium between the transistors. This is because the transistor impedance is reduced if a transistor is overloaded. This reduction is transformed into an impedance increse by the transmission line, with the result that the control current decreases and in the transistor a new thermal equilibrium can arise with the other transistors.

It is to be noted that the Figures are not drawn to scale and that they merely serve to illustrate the principles involved in the various embodiments.

DEFINITION OF SOME TERMS ground conductor — a good conducting ground plate which supports the circuit components and which acts as one of the connections for electric signals. In normal applications of the circuit the ground plate is connected to ground or earth.

transmission line — a waveguide system consisting of two mutually parallel conductors and capable of propagating an electromagnetic wave.

$\lambda$ — wavelength of the dominant wave of a transmission line at a given operating frequency.

$\lambda/n$-transmission line — transmission line whose physical length corresponds to a fraction $n$ of $\lambda$.

homologous points of a transmission line — a point of one conductor and the corresponding point of the other conductor which is situated in the same cross-section, perpendicular to the longitudinal direction.

homologous layers — two layers which are the mirror image of each other with respect to an imaginary plane which is situated between the two layers.

multi-transistor — a structure in which a plurality of transistors are provided on the same substrate which acts as the collector for all transistors.

DESCRIPTION OF THE EMBODIMENTS

Figure 1:
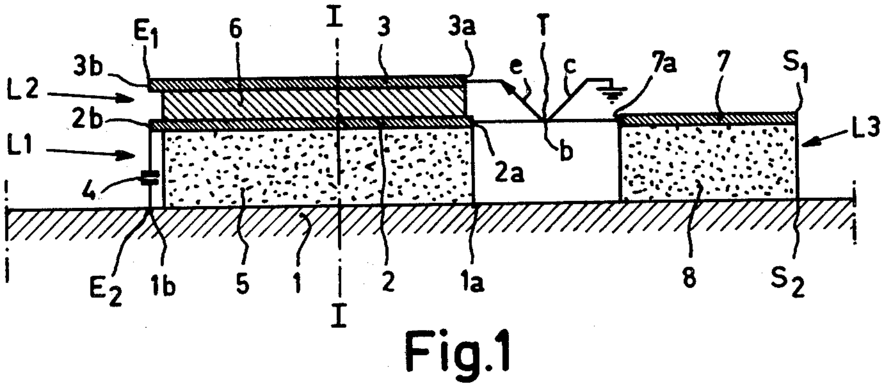
FIG. 1 shows a schematic diagram of an amplifier according to the invention.

The reference 1 in FIG. 1 denotes a ground conductor and the reference T denotes a transistor which constitutes the active part of the amplifier according to the present invention. The base, the emitter and the collector of transistor T are denoted by the references *b*, *e* and *c*, respectively. The collector is directly connected to ground.

A first transmission line $L_1$ is formed by the ground conductor 1 and a conductor 2, and a second transmission line $L_2$ is formed by the conductor 2 and a conductor 3.

The amplifier shown in FIG. 1 has a circuit of the common-base type. The description of a common-emitter type amplifier can be directly derived from the following by substituting the word base for the word emitter and vice versa.

The conductor 2 is connected to the base *b* by way of its end 2*a*, and its other end 2*b* is connected to a coupling member 4 which is connected between the end 2*b* and the homologous point 1*b* of the ground conductor.

The length of the conductors constituting the transmission line $L_1$ is such that it forms a high impedance between point 2*a* of the conductor 2 and the homologous point 1*a* of the ground conductor 1. Because the transmission line $L_1$ terminates in the low impedance of coupling member 4, the length of transmission line $L_1$ must be of the order of $\lambda/4$.

According to transmission line theory, the impedance measured on the input of a short-circuited line is high for a length of between $\lambda/8$ and $3\lambda/8$. In practice such an amplifier can function efficiently in a wide frequency range of more than one octave.

As is known, transmission lines having a length of $\lambda/4$, $3\lambda/4$, $5\lambda/4$ etc. have the same impedance transformation properties. Particularly if these lines are short-circuited on one end, they transform this short-circuit into an infinite impedance. It will be obvious that in this embodiment of the amplifier the $\lambda/4$-transmission lines can be replaced by transmission lines having a length which is an integer number of times $\lambda/2$ larger.

The necessary length can be obtained by folding one of the conductors or by the provision of cuts or grooves.

The conductors 1, 2 and 3 are insulated from each other by filling the spaces between the conductors with insulating materials 5 and 6.

The wavelength depends on the insulating material used, and if F is the frequency and Ke is the dielectric constant of the insulating material under consideration, $$\lambda = \frac{c}{F\sqrt{Ke}};$$

consequently, if $\lambda_o$ is the wavelength in free space, $$\lambda = \frac{\lambda_o}{Ke}.$$

If the insulating material used is a ceramic material for which Ke equals 9, and if the frequency used is 1 GHz, the wavelength in free space is 30 cm. A $\lambda/4$-transmission line which is insulated by the said ceramic material then has a length of 2.5 cm.

The coupling member 4 may be a capacitor or an open $\lambda/4$-transmission line.

The end 3*a* of the conductor 3 is connected to the emitter *e* which constitutes the input of the transistor. The other end 3*b* ($E_1$) constitutes the input of the amplifier in conjunction with the homologous point $E_2$ of ground conductor 1.

The direct current for the transistor T (not shown in FIG. 1) can be advantageously applied at point 2*b* which is free from high-frequency voltages and which is insulated from ground conductor 1.

The shape and the dimensions of the conductor 3, the distance between the conductors 2 and 3, and the insulating material have been chosen such that transmission line $L_2$ offers proper impedance matching between the input $E_1$–$E_2$ and the input of the transistor.

The conductor 2 constitutes an electric shield between the conductors 1 and 3. The two transmission lines $L_1$ and $L_2$ are then decoupled.

The conductor 3 may extend beyond the point $E_1$ in practice without the operation being affected.

In the common-base type amplifier shown in FIG. 1 the amplified signal is derived between the base *b* and the ground conductor 1 by way of a transmission line $L_3$ which is formed by a conductor 7 and the ground conductor 1. One end 7*a* of the conductor 7 is connected to the base and the other end $S_1$, together with the homologous point $S_2$ of the ground conductor 1, constitutes the output of the amplifier. This transmission line $L_3$ can also be used for impedance matching between the transistor and the output $S_1$–$S_2$.

One has on the common point of the input and output (base *b*) on the one hand between the common point and ground a rather high signal level (the output signal) and on the other hand between the said common point and the emitter *e* the control signal of the transistor the emitter and the base floating with respect to ground in the rhythm of the output signal.

The described conductor structures can be readily realised by way of the known multi-layer techniques.

The amplifier can be advantageously realised by shaping the conductors as flat layers, the conductors of the input circuit then being arranged one above the other.

The proces may be, for example, as follows. On a metal ground plate 1 of a good electrically and thermally conducting material, for example, an alloy of iron-nickel-cobalt or copper-silver-gold, two bodies 5 and 8 of a ceramic material or aluminium oxide are attached. The bodies 5 and 8 are soldered to the ground plate by soft-soldering, the said bodies being covered in advance with a metal layer which later constitutes the conductors 2 and 7.

Provided on the conductor 2 is an insulating layer 6, for example, of ceramic or polytetrafluoroethylene, which carries already metallised regions which enable, on the one hand, the soldering of the layer onto the conductor 2 and, on the other hand, the formation of the conductor 3.

The metal layers 2, 3 and 7 consist of a conductive material which is adapted to the method of vapour deposition under vacuum and photo-etching, for example, aluminium or copper.

As is shown in FIG. 2, the layer 6 projects slightly inwards with respect to the body 5, with the result that in the vicinity of point 2*a* a freely accessible region 2*c* is formed on the conductor 2 for connection of the connection wire of the base of the transistor.

The connection wires, of the transistor are bonded to the conductors 2, 3 and 7 by thermo-compression and can have a double construction so as to reduce parasitic inductances. In view of their limited length, the connection wires hardly have a disturbing effect on the performance of the λ/4-transmission line $L_1$. If this line is properly realised, the impedance on the side of the transistor amounts to some thousands of Ohms. If the impedance is reduced to a value of between 200 and 1,000 Ohms because of the presence of the connection wires, the impedance is still more than 100 times higher than the load impedance on the common point which amounts to a few Ohms. Consequently, there is no risk whatsoever of coupling between the output and the input.

In a practical embodiment for a frequency of approximately 2 GHz, the body 5 has a dielectric constant Ke = 9, a length of 12.5 mm, a width of 12.5 mm and a thickness of 1.27 mm. Vapour-deposited on the lower side is a copper layer having a thickness of a few micrometers, and vapour-deposited on the upper side is a copper layer having a width of 1.5 mm and a thickness of a few micrometers.

The ceramic layer 6 has a length of 12.2 mm, a thickness of 0.2 mm and a width of 3.4 mm. The conductor 3 consists of a copper layer having a width of 1 mm and a thickness of a few micrometers which is vapour-deposited in vacuum. In this embodiment the transmission line $L_2$ has a length in excess of λ/4. The capacitor 4 has a value of approximately 50 pF.

Figure 2A:
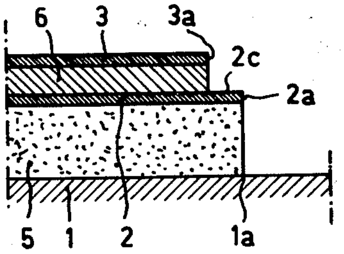
FIGS. 2*a* and 2*b* are cross-sectional views of the input circuit of the amplifier shown in FIG. 1.
Figure 2B:
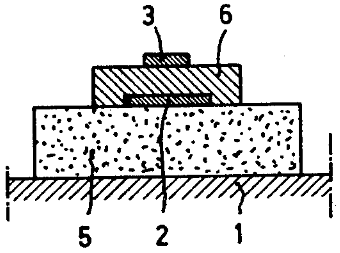

FIG. 2*b* shows the arrangement of the various layers with respect to each other. The conductor 2 performs the function of an electric shield between the conductors 1 and 3 because it projects beyond the latter on both sides.

Figure 2C:
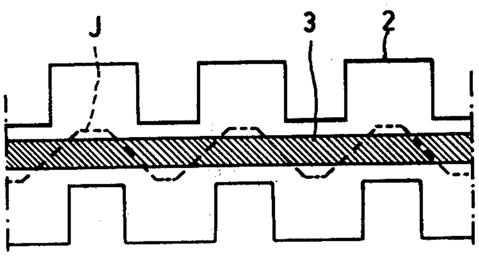
FIG. 2c is a plan view of a further embodiment of the input circuit.

It is to be noted that the conductors can alternatively have a non-rectangular shape. FIG. 2*c* shows a meandered conductor 2. The broken line J represents the mean traject followed by the electromagnetic waves.

It may be advantageous to impart a continuously variable length also to the conductor 3 in order to match the characteristic impedance of the supply line.

The coupling member 4 can be realised by way of a commercially available capacitor, for example, a capacitor of the MOS-type comprising two terminals in the form of microbars which can be secured by thermocompression bonding. It can alternatively be formed by an open λ/4-transmission line, possibly insulated by a ceramic material as described above for the transmission lines $L_1$ and $L_2$.

Figure 2D:
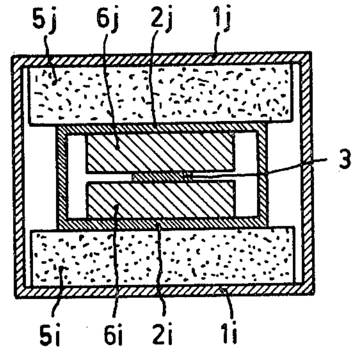
FIG. 2d is a cross-sectional view of another embodiment of the input circuit which is derived from that shown in FIG. 2b.

FIG. 2*d* is a cross-sectional view of an input circuit which in fact constitutes a doubling of the embodiment shown in FIG. 2*b* and which is symmetrical with respect to the plane of the conductor 3. Soldered on a first ground conductor 1*i* which may form part of a box, for example, of aluminium, is a body 5*i* which supports a metal layer 2*i* which forms part of the second conductor, on which an insulating ceramic layer 6*i* is provided which supports the conductor 3 or at least the major part thereof. Thereon is provided a ceramic layer 6*j*, homologous with the ceramic layer 6*i*, which supports a metal layer 2*j* which forms a second part of the second conductor. Thereon is provided a ceramic body 5*j* which is homologous with the ceramic body 5*i* and which supports the conductor region 1*j*. The conductors 1*i* and 1*j* are interconnected and constitute the ground conductor 1; the conductors 2*i* and 2*j* together constitute the second conductor.

Figure 3A:
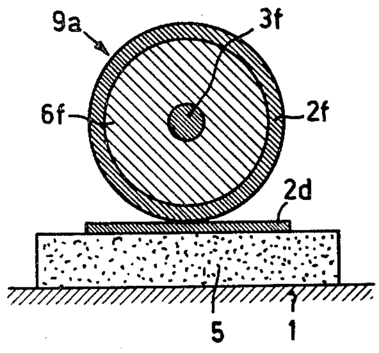
FIGS. 3a and 3b are cross-sectional views of coaxial embodiments.
Figure 3B:
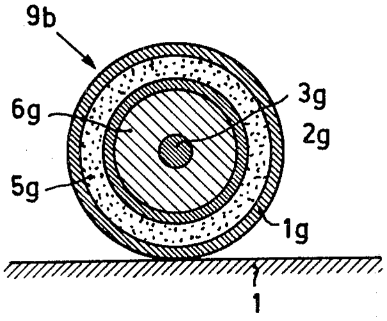
Figure 3C:
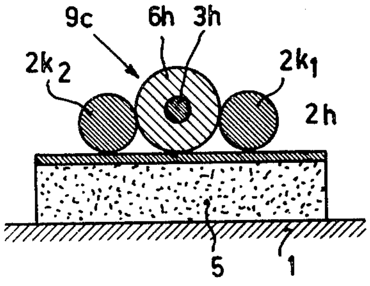
FIG. 3c is a cross-sectional view of still another embodiment of the input circuit.

FIGS. 3*a*, 3*b* and 3*c* are diagrammatic cross-sectional views of the input circuit in three different embodiments utilising commercially available cables.

In the embodiment shown in FIG. 3*a* a ceramic body 5 is soldered on the mass conductor 1. This body supports a conductor 2*d* on which a coaxial cable 9*a* is soldered, the outer conductor thereof being denoted by the reference 2*f*. The assembly of the conductors 2*d* and 2*f* forms the second conductor of the input circuit, the part 2*d* determining the characteristic impedance of the transmission line $L_1$ of the input circuit. The second transmission line $L_2$ is insulated by the insulating material 6*f* of the cable 9*a*. The third conductor is formed by the inner conductor 3*f* of the same cable, the capacitance thereof being zero with respect to the ground conductor because the outer conductor 2*f* constitutes an electric shield.

In the embodiment shown in FIG. 3*b* a triaxial cable 9*b* is soldered on the ground conductor 1, the outer conductor 1*g* of the triaxial cable constituting the first conductor. The second conductor and the third conductor are formed by the middle conductor 2*g* and the central conductor 3*g*, respectively, of the triaxial cable 9*b*. The insulation between the conductors is formed by the dielectric layers 5*g* and 6*g* of the triaxial cable.

The ground part 1 can be dispensed with, the jacket 1*g* of the triaxial cable then being used as the ground plate.

The advantages of this embodiment are its simplicity and its compatibility when the remainder of the circuit is realised by means of coaxial and triaxial cables.

In the embodiment shown in FIG. 3*c* use is made of a commercially available insulated conductor. The ground conductor 1 supports the insulating body 5 on which is provided the second conductor which is formed by a thin metal layer 2*h* and two conductors 2*k*1 and 2*k*2 which bear on the layer 2*h* and which are arranged on both sides of the conductor 3*h* which constitutes the third conductor. This conductor 3*h* is the central part of an insulated conductor 9*c*, the insulating part 6*h* of which constitutes the insulation of the second transmission line.

The wires 2*k*1 and 2*k*2 enhance the coupling between the conductors 2 and 3 and form an electric shield between the conductors 1 and 3*h* and enable the impedance of the second transmission line to be adjusted to a desired value.

Figure 4:
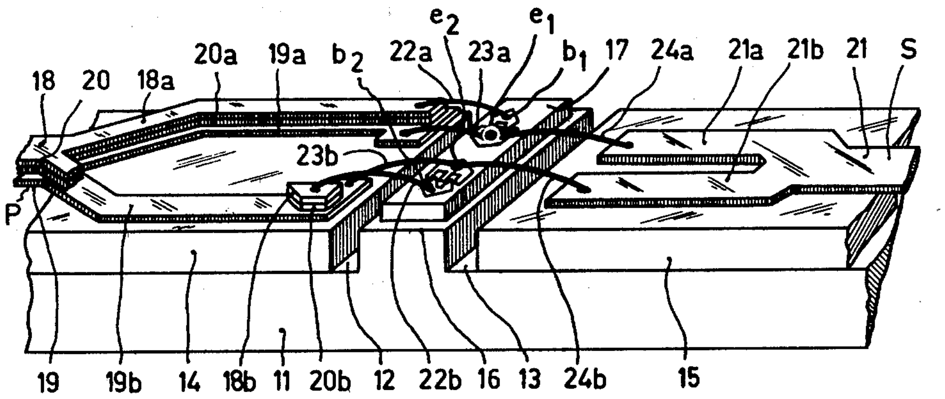
FIG. 4 is a perspective view of an amplifier according to the invention which is provided with a multi-transistor.

FIG. 4 is a more detailed view of an amplifier in commonemitter connection according to the principle shown in the FIGS. 1, 2*a* and 2*b*, the amplifier comprising a multi-transistor consisting of two transistors.

Two cavities 12 and 13 are provided in a metal body 11. This body constitutes the ground conductor. The insulating ceramic bodies 14 and 15 are soldered in these cavities 12 and 13. Soldered on the part 16 is a substrate 17 which comprises two transistors with the base contacts *b*1 and *b*2 and the emitter connections *e*1 and *e*2. The collectors of the two transistors are formed by the substrate 17.

The second conductor and the third conductor of the input circuit are formed on the body 14 at 19 and 18, respectively. These conductors 19 and 18 are split into the conductors 19*a* and 19*b*, 18*a* and 18*b*, respectively. The length of the conductors 19*a* and 19*b* between their common point P and the emitters *e*1, *e*2 is substantially equal to λ/4. The coupling member 4 between the second and the first conductor (FIG. 1) is not shown in FIG. 4. This coupling member must be provided at the area of the point P between the conductor 19 and the body 11 in FIG. 4.

The conductors 19 and 18 are insulated with respect to each other by an insulating layer 20 which is made, for example, of a ceramic material and which may have the same configuration as the conductors 19 and 18 and which is split into the layers 20*a*, 20*b*.

Provided on the body 15 are the metal layers 21*a*, 21*b* which are connected to the emitters *e*1, *e*2 which, after a distance which is substantially equal to λ/4, are joined to form a single conductor 21 on the output S of the amplifier.

FIG. 4 shows the connection wires 22*a* and 22*b* which connect the conductors 18*a* and 18*b* to the bases *b*1 and *b*2; also shown are the connection wires 23*a* and 23*b* between the conductors 19*a* and 19*b* and the emitters *e*1 and *e*2 and the connection wires 24*a* and 24*b* between the conductors 21*a* and 21*b* and the emitters *e*1 and *e*2. These different connections, generally realised by thermo-compression, are very short.

Figure 5:
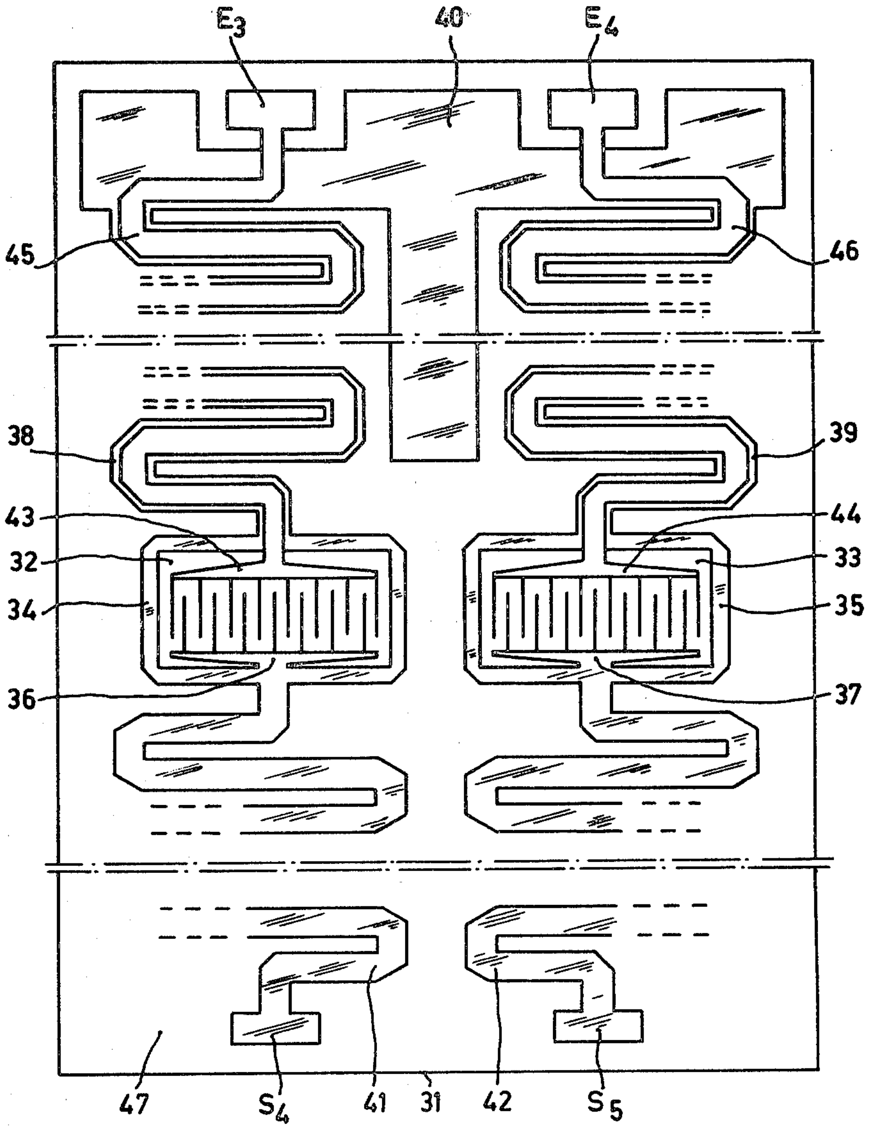
FIG. 5 is plan view of an amplifier according to the invention in integrated form.

FIG. 5 is a diagrammatic plan view of an amplifier which is formed on a substrate 31 which comprises two transistors 32 and 33. The metal layers 34 and 35 which are connected to the contact regions 36 and 37 of the emitters of the transistors 32 and 33 are connected, via the second conductors 38 and 39, to the metal layer 40 which constitutes one of the coatings of the coupling capacitor and are also connected to the output conductors 41 and 42 to the outputs $S_4$ and $S_5$.

The base contact regions 43 and 44 of the transistors 32 and 33 are connected to the inputs $E_3$ and $E_4$ via the third conductors 45 and 46 which have the same configuration as the conductors 38 and 39 and which are insulated with respect to the latter by way of dielectric layer which is not shown in the Figure. The transmission lines which are formed by the conductors 38 and 45 and 39 and 46 have a length of λ/4.

The conductors 34, 35, 38, 39, 40, 41, 42 can be obtained from a metal layer by etching, the said layer being provided on the surface of the oxide layer 47 which covers the substrate 31, windows being formed in the said layer 47 in advance so as to establish contacts with the emitters and the bases 36, 37, 43 and 44. The conductors 45 and 46 can be obtained by local deposition of a metal layer.

An embodiment of this kind provides an amplifier in which the absence of connection wires results in the disappearance of the parasitic inductances and capacitances. Parasitic inductance is notably removed from the common point of the input and the output, with the result that the gain is maximum.

What is claimed is:

1. An amplifier for high-frequency signals, comprising:

a conductive ground plate;

first and second conductors parallel to each other and parallel to said ground plate forming a first transmission line between said ground plate and said first conductor and forming a second transmission line between said first conductor and said second conductor, said first conductor shielding said second conductor from said ground plate;

a transistor mounted on said ground plate adjacent one end of said first and second conductors, said transistor having a collector in thermal and electrical contact with said ground plate and having an emitter and base one of which is electrically connected to said first conductor and the other of which is electrically connected to said second conductor;

a coupling member, which blocks direct current but has low impedance to the high-frequency electrical signals to be amplified, connecting said first conductor to said ground plate at a distance from said one end of said first conductor such that said coupling member presents a high impedance to the high-frequency electrical signals at said one end of said first conductor.

2. An amplifier as defined in claim 1 wherein said first and second conductors are metal layers mutually spaced from each other and from said ground plate by insulating layers.

3. An amplifier as defined in claim 1 wherein said first conductor is the outerconductor of a coaxial two-conductor system and said second conductor is the inner conductor thereof.

4. An amplifier as defined in claim 3 wherein said second conductor is the central conductor of a coaxial three-conductor system, said first conductor is the central conductor of said system and the outer conductor of said system is electrically connected with said ground plate.

5. An amplifier as defined in claim 1 wherein said first conductor comprises a metal layer spaced from said ground plate by an insulating layer and two parallel spaced conductors in longitudinal contact with said metal layer, said second conductor comprising a conductor enveloped by an insulating jacket and positioned parallel to and between said parallel spaced conductors.

* * * * *

UNITED STATES PATENT AND TRADEMARK OFFICE
CERTIFICATE OF CORRECTION

PATENT NO. : 3,906,387

DATED : September 16, 1975

INVENTOR(S) : HUBERT MARTEL and PIERRE PARIS

It is certified that error appears in the above-identified patent and that said Letters Patent are hereby corrected as shown below:

IN THE TITLE PAGE

Section [73], change Assignee from "U.S. PHILIPS CORPORATION" to --Societe Anonyme R.T.C. LA RADIOTECHNIQUE-COMPELEC--;

Section [30], change Priority No. from "73.073535" To -- 73.07535--.

Signed and Sealed this

Third Day of August 1976

[SEAL]

*Attest:*

RUTH C. MASON
*Attesting Officer*

C. MARSHALL DANN
*Commissioner of Patents and Trademarks*